(12) United States Patent
Dang et al.

(10) Patent No.: US 9,820,395 B2
(45) Date of Patent: Nov. 14, 2017

(54) LOW COST HERMETIC MICRO-ELECTRONICS

(71) Applicant: International Business Machines Corporation, Armonk, NY (US)

(72) Inventors: Bing Dang, Chappaqua, NY (US); John U. Knickerbocker, Monroe, NY (US); Minhua Lu, Mohegan Lake, NY (US); Jae-Woong Nah, Closter, NJ (US); Robert John Polastre, Cold Spring, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/212,330

(22) Filed: Jul. 18, 2016

(65) Prior Publication Data

US 2017/0196104 A1    Jul. 6, 2017

Related U.S. Application Data

(62) Division of application No. 14/984,227, filed on Dec. 30, 2015.

(51) Int. Cl.
| | |
|---|---|
| *H01L 23/15* | (2006.01) |
| *H05K 5/00* | (2006.01) |
| *H05K 5/02* | (2006.01) |
| *H05K 5/04* | (2006.01) |

(52) U.S. Cl.
CPC ......... *H05K 5/0095* (2013.01); *H05K 5/0247* (2013.01); *H05K 5/04* (2013.01)

(58) Field of Classification Search
CPC . H01L 31/0488; H01L 23/3121; H01L 23/15; H01L 21/786; H01L 257/788; H01L 257/692
USPC .................. 257/788, 692; 136/259; 438/126; 345/501
See application file for complete search history.

(56) References Cited

U.S. PATENT DOCUMENTS

| | | | | | |
|---|---|---|---|---|---|
| 5,572,789 | A | * | 11/1996 | Fisher | ................. H01L 21/4882 257/E23.103 |
| 5,783,464 | A | * | 7/1998 | Burns | ..................... H01L 21/50 257/E21.499 |
| 6,136,419 | A | * | 10/2000 | Fasano | .................... B32B 18/00 174/250 |

(Continued)

*Primary Examiner* — Alexander Oscar Williams
(74) *Attorney, Agent, or Firm* — Fleit Gibbons Gutman Bongini Bianco PL; Donna Flores

(57) ABSTRACT

A hermetically sealed electronic device and method of fabrication are provided. A base layer of a wafer is created using a substrate formed from ultra-thin glass or ceramic using panel or roll to roll processing. One or more layers are bonded to the base layer. The wafer is singulated into a plurality of electronic devices having a top surface and a plurality of sides. A hermetic sealant is applied to each electronic device to completely encase the top surface and the sides while bonding to the base layer. At least one of the layers is a metallization layer formed by metal deposition. Full metallization may be applied over the entire wafer and a pattern subsequently transferred to the full metallization by one of laser and chemical etching. The electronic device may further include at least one electronic component attached to one of the layers and encased by the hermetic sealant.

6 Claims, 6 Drawing Sheets

(56) References Cited

U.S. PATENT DOCUMENTS

| | | | |
|---|---|---|---|
| 2005/0114955 A1* | 5/2005 | Grote | A01H 5/10 800/320.1 |
| 2013/0106868 A1* | 5/2013 | Shenoy | B81C 1/00269 345/501 |
| 2013/0135317 A1* | 5/2013 | Shenoy | B81C 1/00047 345/501 |
| 2013/0214405 A1* | 8/2013 | Bauer | B81C 1/00269 257/692 |
| 2014/0158201 A1* | 6/2014 | Aitken | H01L 31/0488 136/259 |

* cited by examiner

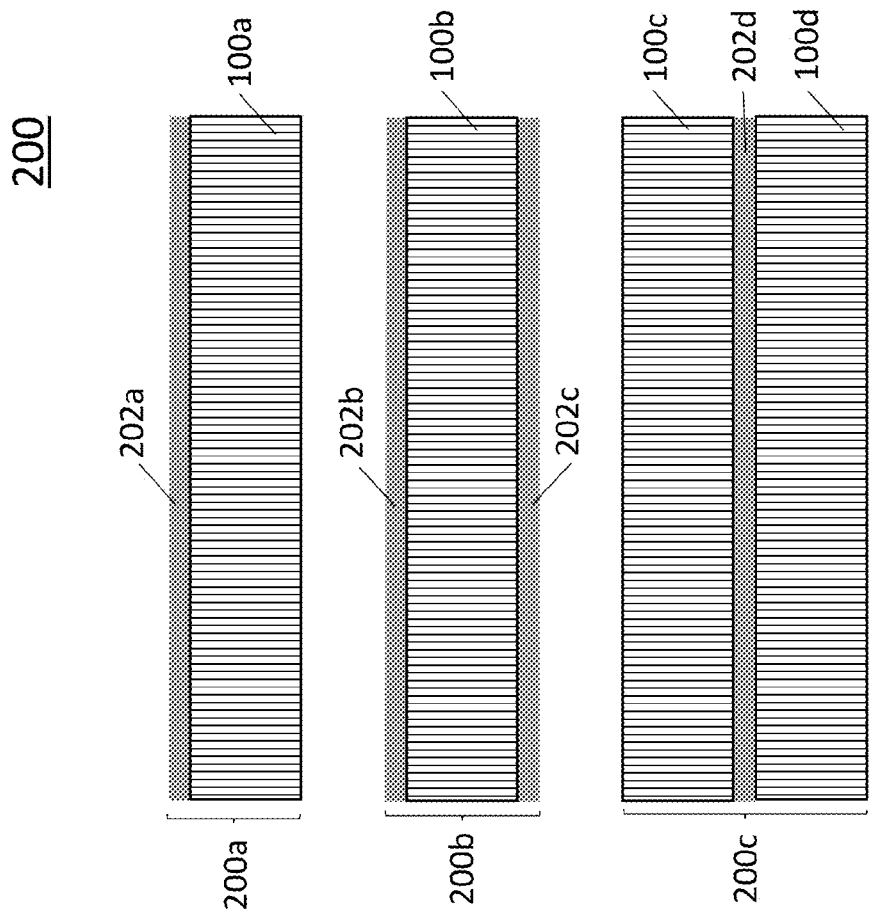

US 9,820,395 B2

LOW COST HERMETIC MICRO-ELECTRONICS

BACKGROUND

The present disclosure generally relates to microelectronics packaging, and more particularly relates to lost cost, high volume hermetically sealed packaging solutions for interconnection and applications such as Smart Tags, Internet of things (IOT) sensors or tags, wearable sensors, health care monitoring and implantable microelectronic devices.

Many electronic devices have a need to be hermetically sealed for protection against the environment. However, current solutions to protect many devices are large, bulky and expensive to manufacture. For example, pacemakers must be protected against the fluids contacting the device so that the electronics do not corrode, thereby injuring and endangering the wearer and shortening the life of the device. Today, most pacemakers are encased in relatively large titanium boxes (e.g., around 1" to 2" square and about ½" in thickness) which are welded shut and implanted within a body. The wearer's life depends upon proper functionality and replacement of the pacemaker requires invasive surgery.

There is a need for lower cost hermetically sealed devices for biological use (e.g., wearable and implantable in humans and animals) that are environmentally friendly and can be fabricated at a low cost, high volume and small size.

BRIEF SUMMARY

In one embodiment, a method for fabricating a hermetically sealed electronic device is disclosed. A base layer of a wafer is created using a substrate formed from ultra-thin glass or ceramic using panel or roll to roll processing. One or more layers are bonded to the base layer. The wafer is singulated into a plurality of electronic devices having a top surface and a plurality of sides. A hermetic sealant is applied to each electronic device such that the hermetic sealant completely encases the top surface and the plurality of sides while bonding to the base layer.

In another embodiment, a hermetically sealed electronic device, comprises a top surface, a plurality of sides, a base layer formed from a substrate of ultra-thin glass or ceramic using panel or roll to roll processing, one or more layers bonded to the base layer, and a hermetic sealant completely encasing the top surface and the plurality of sides while bonding to the base layer.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 1 is a cross-sectional illustration of one example of an ultra-thin glass and/or ceramic substrate according to one embodiment of the present disclosure;

FIG. 2 is a cross-sectional illustration showing three ultra-thin glass and/or ceramic structures, one having a top-side metallization layer, one having both top and bottom-side metallization layers, and one having a metallization layer embedded between two ultra-thin glass and/or ceramic substrates according to one embodiment of the present disclosure;

DETAILED DESCRIPTION

Figures 3, 4:
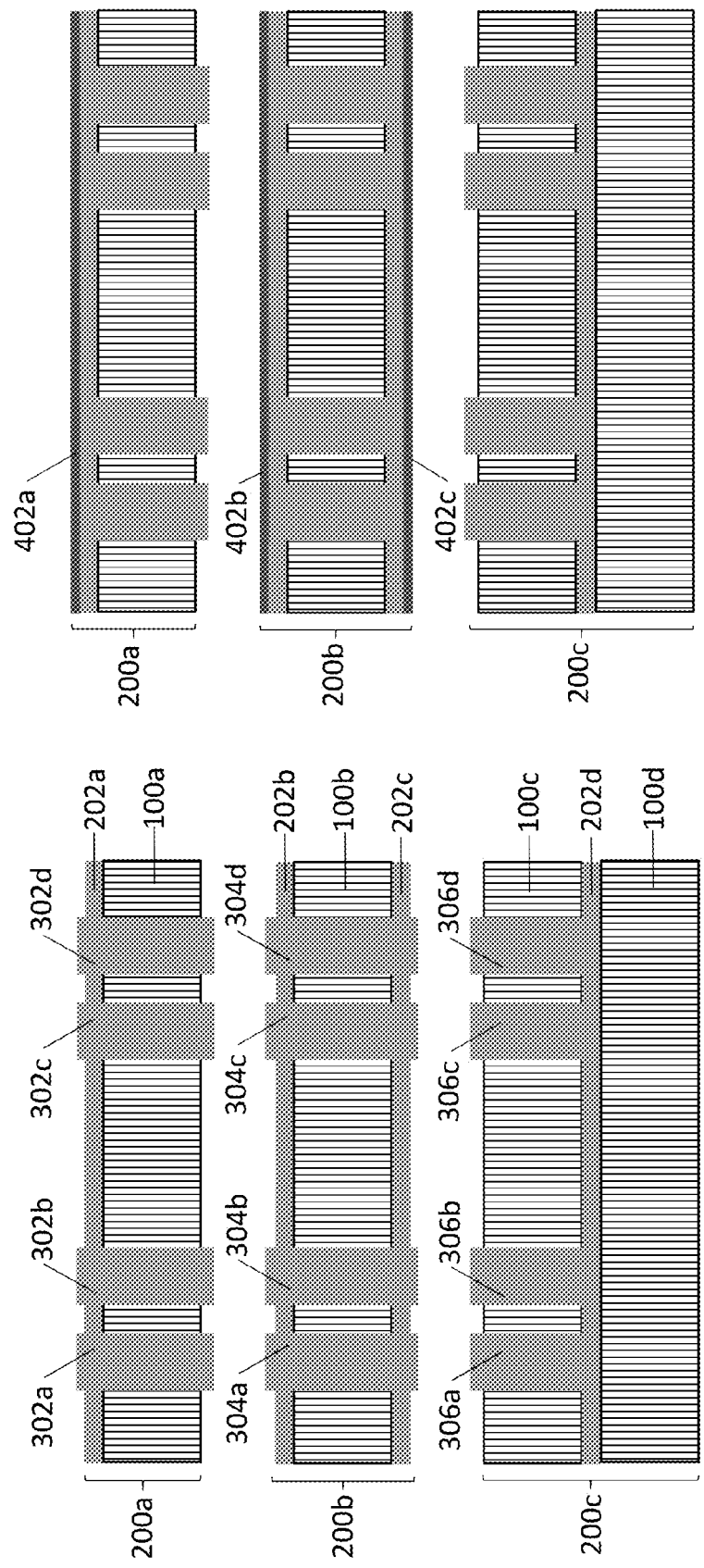
FIG. 3 is a cross-sectional illustration showing the ultra-thin glass and/or ceramic structures of FIG. 2 having vertical interconnections according to one embodiment of the present disclosure.
FIG. 4 is a cross-sectional illustration showing the ultra-thin glass and/or ceramic structures of FIG. 3 having a surface layer seal for hermeticity over the surface metallization layers according to one embodiment of the present disclosure.

In this disclosure, a method is provided for use of ultra-low cost, sealed, silicon, metal, glass, polymer, composite and/or ceramic structures that can provide bio-compatibility, environmental compatibility and corrosion protection to a component, sub-component or system. Use of the disclosed methods allow for lower cost Internet of Things (IOT) sensors; health care sensors; wearable sensors; implantable sensors, systems and or tags; industrial sensors, smart tags (i.e. an electronic tag that can have information added and/or removed over time); RFID tags; and other electronic and/or optical systems. Hermetically sealed packages avoid corrosion, and are compatible with wearable and implantable solutions for human and pet use.

The disclosed methods also support high volume, small size fabrication and are environmentally friendly. The sealed electronics are isolated for bio-compatibility, electronic and/or optical functional operation, wired and/or wireless communication, environmental compatibility and avoid system failure against product specifications. In some cases, the electronics and/or optical function of the system and the electrical and/or optical sensing, communications and/or power transfer to and from the electronics system, another component, sensor or electronic device (e.g., smart phone, storage device) and from the sensors, electrodes are connected by some means, such as but not limited to, a sealed or hermetic electrical feed-through, optical feed-through, inductive coupling, Near Field Communication (NFC), Radio Frequency (RF) or other component or system.

FIG. 1 shows one example of an ultra-thin glass and/or ceramic substrate 100 for use in one embodiment of the disclosure. The substrate 100 comprises a planar surface that may be attached to a wafer or panel, such as silicon or glass, to support precision, flat semiconductor-like processing for precision building and sealing. The substrate 100 acts as a base layer that may be combined with one or more layers of metal, silicon or other semiconductor, polymer, other substrate layers or combinations to build small, thin, low cost, hermetically sealed electronic devices in large volumes. Alternately, the substrate may be formed using roll to roll processing for sheets of thin glass or ceramic material.

Substrate 100 may have the top, bottom or both top and bottom sides covered by a metallization layer. For example, FIG. 2 shows cross-sectional illustrations of a portion of three wafers 200a, 200b, 200c (referenced generally as wafer 200). Wafer 200a includes a single ultra-thin glass or ceramic substrate 100a having a top layer metallization 202a. Wafer 200b includes a single ultra-thin glass or ceramic substrate 100b having a top metallization layer 202c and a bottom metallization layer 202c. Wafer 200c includes a single metallization layer 202d sandwiched between two ultra-thin glass or ceramic substrates 100c, 100d. Wafer 200c may be formed, for example, by applying the metallization layer 202d to either the bottom side of substrate 100c or the top side of substrate 100d and adhering the other substrate 100c, 100d to the metallization layer 202d.

The metallization layer 202 may be formed by metal deposition. Generally, the metallization layer 202 is formed by applying full metallization over the entire wafer and subsequently transferring a pattern (e.g., by precision laser or chemical etching, by photolithography with resist materials, etching, metal depositions, chemical-mechanical polishing or alternate techniques) for surface metallizations, interconnects such as wiring, vias, hermetic sealed vias and capping metals such as but limited to Ni/Au, Pt, or Pd. Alternately, the metallization layer 202 may be formed by metal deposition in a surface pattern. The metallization layer 202 may be formed of conductive alloy combinations such as Cr/CrCu/Cu, Ti/TiN, Ta/TaN Ti/TiN/Cu/Ni/Au, Ta/TaN/Cu/, Ta/TaN Cu, Ta/TaN Ni, Ta/TaN/Cu/Ni/Au, Ta/TaN/Pt or an alternate metal. The sealed interconnection conductor may use a Ta/TaN/Cu via with Ni/Au cap or Pt or Ta/TaN/Ni and Au cap or alternate metallurgy for a sealed pass through wire(s) or via(s).

The top and/or bottom side metallization layers may be applied and followed by edge and/or vertical via formation and metallization. Alternately, the edge and/or via formation may be performed first, followed by then top and bottom side metallization. FIG. 3 shows the three wafers 200a, 200b, 200c after undergoing via forming and metallization processes. Wafer 200a includes four vias 302a, 302b, 302c, 302d traversing the micro-electronic wafer 200a from the top metallization layer 202a, through the substrate 100a. Wafer 200b includes four vias 304a, 304b, 304c, 304d connecting the top metallization layer 202b to the bottom metallization layer 202c through the substrate 100b. Wafer 200c includes four vias 306a, 306b, 306c, 306d which penetrate through substrate 100c to the metallization layer 202d without going through substrate 100d.

Vias may formed via laser ablation such with a picosecond ultraviolet laser or alternate laser ablation tool and process, reactive ion etching (RIE), deep reactive ion etching (DRIE), chemical etching, combinations of the above or alternate techniques. Surface bonding various layers and/or barrier layers, such as with $SiO_2$/SiN, SiN, $Si_3N_4$, Ta/TaN, Ti, Al, Au, Pt, TaN/Ta, TiN/Ti, etc. Additionally, vias may be filled using plated metals, conductive polymers or other metal deposition, such as Cu, or filled with injection molded solder.

Turning now to FIG. 4, two of the wafers 200a, 200b have been surface sealed for hermeticity by adding a sealant layer 402a, 402b, 402c over the surface metallization layers 202a, 202b, 202c. The sealant layer 402a, 402b, 402c use a sealant such as SiN, $Si_3N_4$, $SiO_2$, Si, Ti, metal, ceramic, glass, polymer, or a combination of sealant materials. Alternately, the surface deposition may be patterned by mask, resist or an alternate method. Die, electronic components, interconnectors, wafer level adhesive conductor, underfill and/or seal components may be added prior to or after joining and layer to layer bonding/interconnection.

Figure 6:
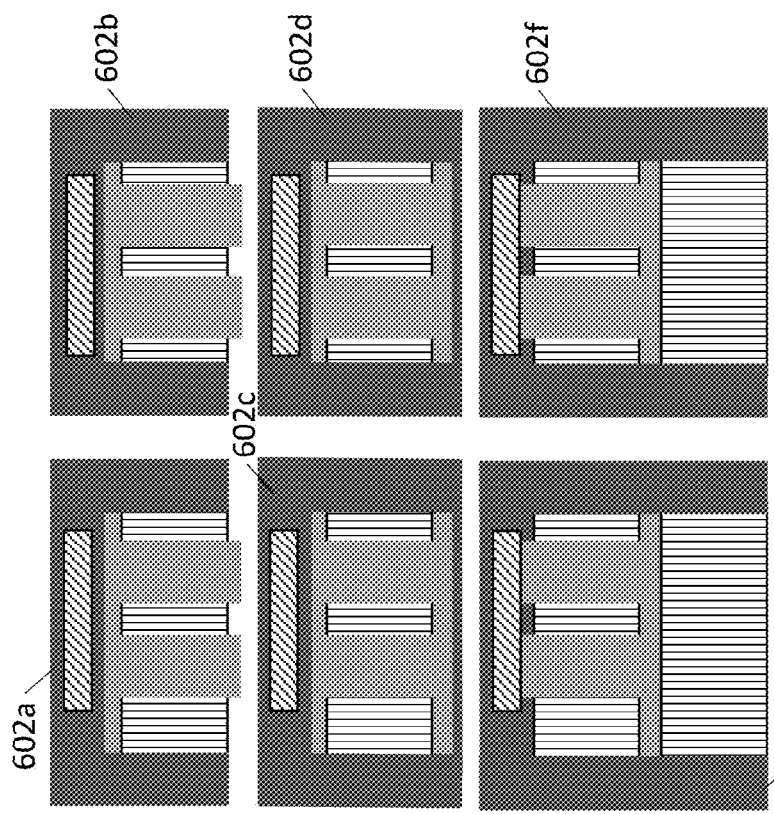
FIG. 6 is a cross-sectional illustration showing the ultra-thin glass and/or ceramic structures of FIG. 5 after application of a sealant to the top and side surfaces according to one embodiment of the present disclosure.
Figure 5:
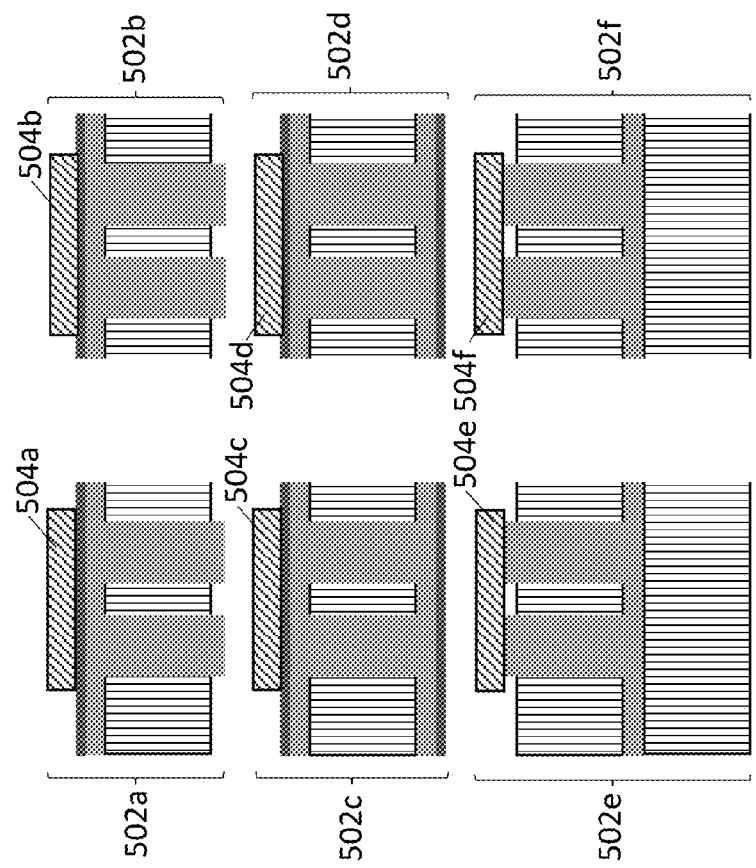
FIG. 5 is a cross-sectional illustration showing the ultra-thin glass and/or ceramic structures of FIG. 4 after singulation according to one embodiment of the present disclosure.

FIG. 5 illustrates the wafers 200a, 200b, 200c after precision singulation into individual micro-electronic devices 502a, 502b, 502c, 502d, 502e, 502f (referenced generally as micro-electronic device 502) by laser, laser and chemical etch, reactive ion etch (RIE), deep reactive ion etch (DRIE) or an alternate method. The wafers 200 are capable of low cost processing from one to over 10 million components, sub-systems or systems per wafer. The wafers 200 may be singulated into micro-electronic devices 502 pre-assembly and integration of die, battery, sensor and or other components. The micro-electronic devices 502a, 502b, 502c, 502d, 502e, 502f are shown in FIG. 5 having additional components 504a, 504b, 504c, 504d, 504e, 504f mounted to the top-side surface post singulation. Alternately, wafers 200a, 200b, 200c may have additional components 504a, 504b, 504c, 504d, 504e, 504f mounted to the top-side surface and encased in a sealant prior to precision singulation. As shown in FIG. 6, each individual micro-electronic device 502 may have a sealant layer 602a, 602b, 602c, 602d, 602e, 602f deposited on the top, bottom and/or side surfaces by means of deposition of a hermetic barrier film such as $SiO_2$, SiN, $Si_3N_4$, Ti, Metal, Si or other barrier film with hermetic seal capability. Examples of film deposition methods may include but not limited to sputter, evaporation, chemical vapor deposition (CVD), plasma enhanced chemical vapor deposition (PECVD), atomic layer deposition (ALD), etc. Alternately, the sealant may be deposited only on the top and side surfaces if a hermetic/strong bond to the ultra-thin glass or ceramic substrate 100 can be guaranteed, or one or more of the sides, top or bottom may be left unsealed if needed. Similarly, the hermetic packaging may have one or more materials which may be exposed to the targeted environment, moisture, salt water or other corrosive application environment whereas to permit electrical, optical, wired, wireless power feedthrough, communication or for an alternate reason and in all cases these surfaces and feedthrough or communication compatible materials can be selected to satisfy the application requirements. Examples may include a Ti or SiN or $Si_3N_4$ sealed structure with a sapphire window so as to permit wireless communication through the window. These small electronic devices may be used in IOT sensors, wearable sensors, integrated smart tags, sealed batteries or other components, sub-components or micro systems.

Figure 7:
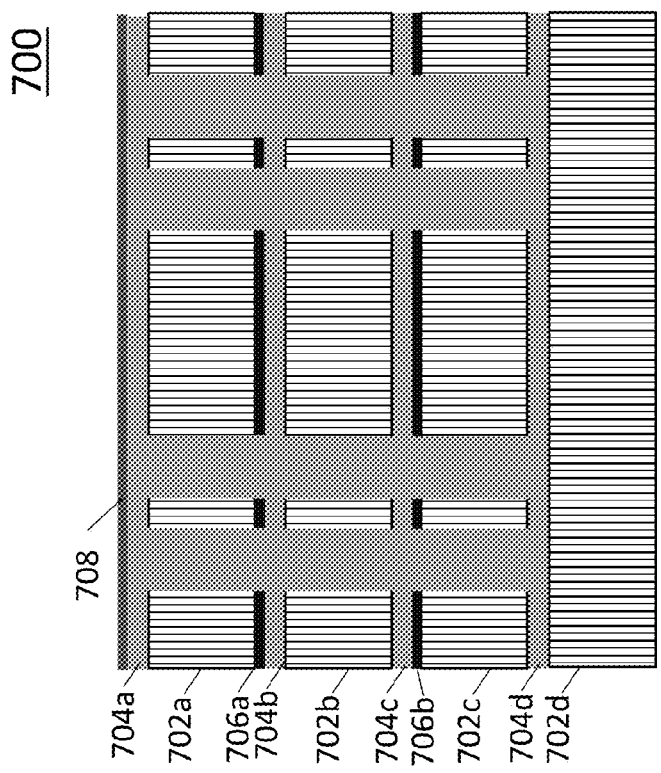
FIG. 7 is a cross-sectional illustration showing a stack-up of an ultra-thin glass and/or ceramic structure having multiple substrates bonded together according to one embodiment of the present disclosure.

FIG. 7 shows an example multi-layer wafer 700 having four ultra-thin glass or ceramic substrate layers 702a, 702b, 702c, 702d. Substrate 702a has a top metallization layer 704a, while substrate 702b has both a top metallization layer 704b and a bottom metallization layer 704c, and substrates 702c and 702d have a metallization layer 704d sandwiched between them. The bottom of substrate 702a is adhered to the top metallization layer 704b of substrate 702b via an adhesive layer 706a. The bottom metallization layer 704c of substrate 702b is adhered to substrate 702c via adhesive layer 706b. A sealant layer 708 may be applied over the top and/or bottom layers of wafer 700.

Each layer of wafer 700 may have a different purpose. For example, the top metallization layer 704a and the first substrate 702a may include circuitry and electronic components for a sensor and/or communication layer including but not limited to one or more antenna for wireless RF communication and/or power transfer, optical transceivers, mirrors, photo-voltaics or Si photonics and/or lens to support light communication and/or power communication, a transponder for ultrasonic sound communication and/or power transfer, combinations of the above or alternate communications and power enablement. Metallization layers 704b, 704c and substrate 702b may include circuitry for a microprocessor and/or memory layer. Substrates 702c, 702d and metallization layer 704d may be a capacitor or battery layer.

Figure 8:
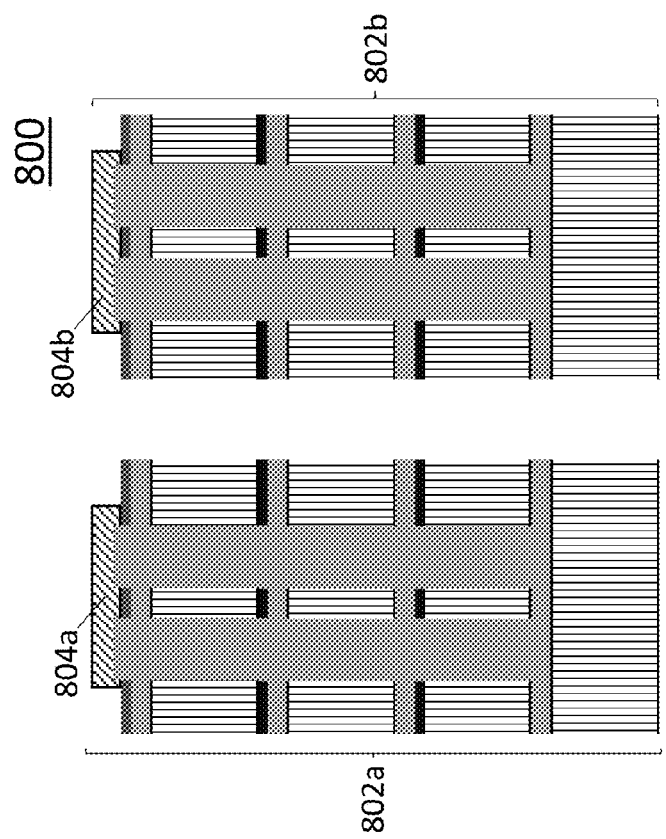
FIG. 8 is a cross-sectional illustration showing the ultra-thin glass and/or ceramic structures of FIG. 7 after singulation according to one embodiment of the present disclosure.

Wafer 700 may be singulated into individual micro-electronic devices 802a, 802b by precision singulation by laser, laser and chemical etch, RIE, DRIE or alternate method prior to assembly and integration of die, battery, sensor and/or other components 804a, 804b, as shown in FIG. 8. Alternately, wafer 700 may be assembled with the die, battery, capacitor, sensor and/or other components 904a, 904b integrated and a sealant layer 906a, 906b applied before singulation into individual micro-electronic devices 902a, 902b by precision singulation, as shown in FIG. 9.

Figures 9, 10:
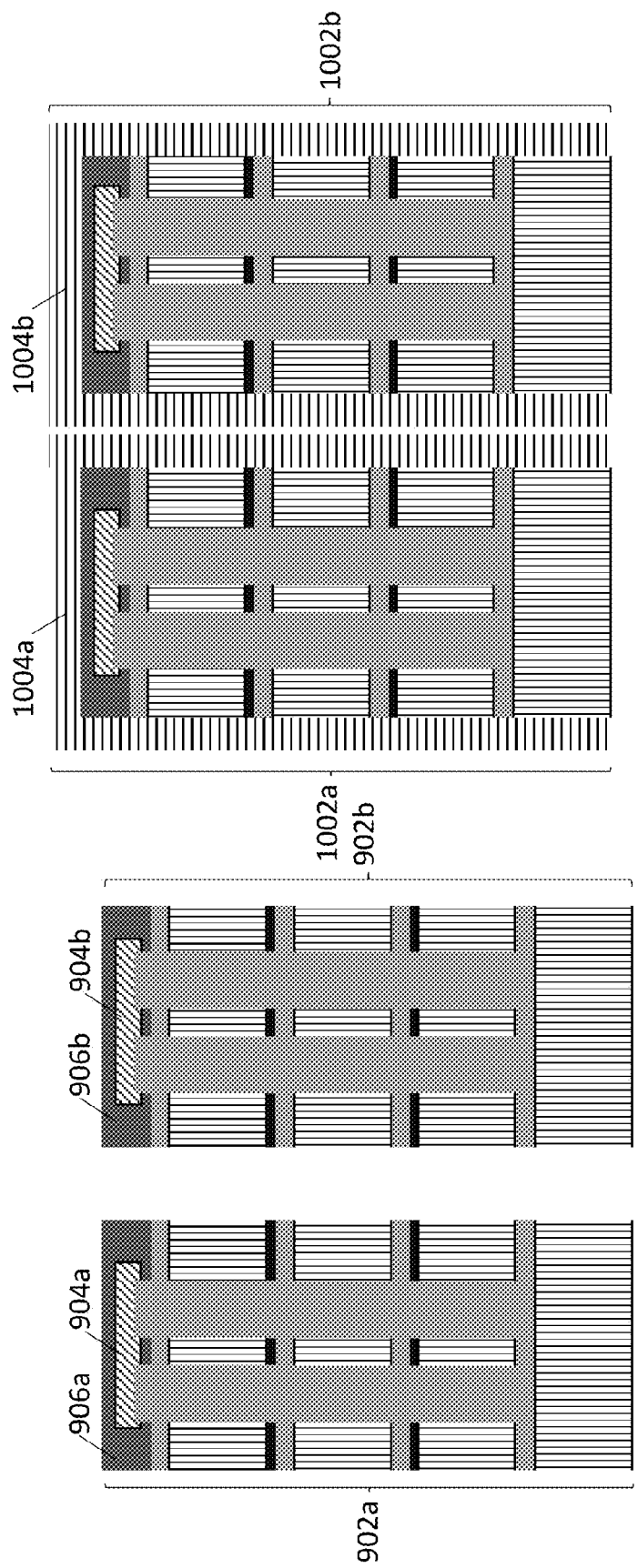
FIG. 9 is a cross-sectional illustration showing the ultra-thin glass and/or ceramic structures of FIG. 8 after application of a sealant to the top surfaces according to one embodiment of the present disclosure.
FIG. 10 is a cross-sectional illustration showing the ultra-thin glass and/or ceramic structures of FIG. 9 after encapsulation of the individual structures in a sealant according to one embodiment of the present disclosure.

Turning now to FIG. 10, micro-electronic devices 1002a, 1002b may be hermetically encapsulated after precision singulation by means of deposition of a hermetic seal 1004a, 1004b (or hermetic barrier film) such as $SiO_2$, SiN, $Si_3N_4$, Ti, Metal, Si or other barrier film with hermetic seal capability.

Option to have electronics sealed or hermetically sealed in application with electronics such as micro-controller, memory, sensor function, capacitors, battery or alternate energy source, electrodes, antenna and/or alternate communication means, such as a receiver, transmitter, transceiver, etc., using bio-compatible material such as Ti, $SiO_2$, SiN or alternate material. Examples of alternate communication methods for data transfer and/or power transfer include use of photo-voltaics, mirrors, lenses, Light emitting diodes (LEDs), for use with light, antenna for use with radio frequency (RF) or near field communication (NFC), near proximity capacitive electrodes for capacitive or inductive means and/or piezo-electric transducers for use with sound, ultrasound, vibration or other methods.

It should be noted that electronic devices having microsystems may be all contained in one layer or may be in multiple layers with sealant 1004a, 1004b on bottom, sides and/or top.

Figure 11:
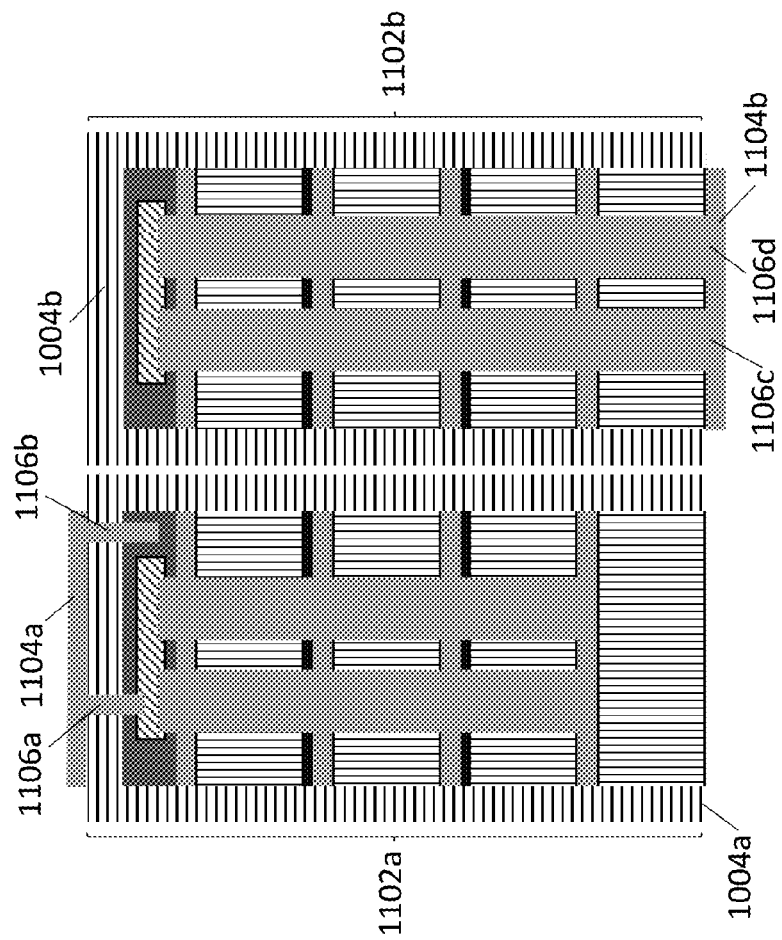
FIG. 11 is a cross-sectional illustration showing the ultra-thin glass and/or ceramic structures of FIG. 10 electronically connected to an external device located outside the hermetic seal according to one embodiment of the present disclosure.

Referring now to FIG. 11, in certain instances, it may be desired to have the sealed micro-electronic devices 1102a, 1102b coupled to other external electronics 1104a, 1104b, such as a microcontroller, a memory, a sensor, capacitors, a battery or alternate energy source, a power management system, electrodes, an antenna and/or alternate communication means, etc. In such cases, the micro-electronic devices 1102a, 1102b may have an electrical or optical path through the hermetic seal 1004a, 1004b connecting to one or more external components 1104a, 1104b via another electrical or optical path outside the hermetic seal 1004a, 1004b such that the hermetic seal 1004a, 1004b does not interfere with the communication path to another communication device.

In FIG. 11, metallic electrodes 1106a, 1106b, 1106c, 1106d extend through the hermetic seal 1004a, 1004b to contact electronic components 1104a, 1104b. Alternately, some other conductive connection, such as an interconnector, may protrude through the hermetic seal 1004 for connection to one or more external components 1104. Additionally, or alternatively, the hermetic seal 1004 may include apertures extending to contact points such that a connector or other conductive connecting point may extend from an external component 1104 to contact the micro-electronic device.

Figure 12:
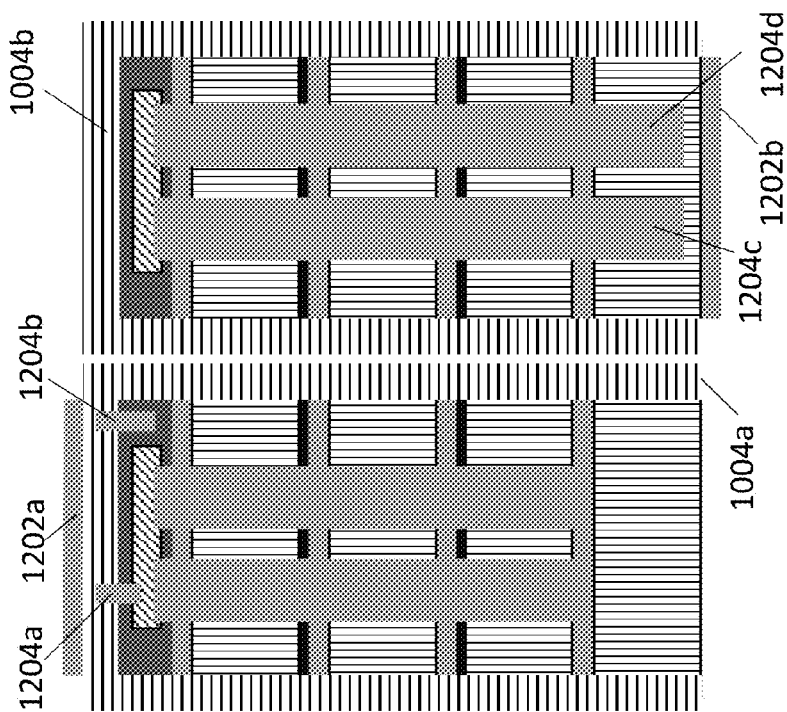
FIG. 12 is a cross-sectional illustration showing the ultra-thin glass and/or ceramic structures of FIG. 10 inductively coupled to an external device located outside the hermetic seal according to one embodiment of the present disclosure.

Alternately, as shown in FIG. 12, the external components 1202a, 1202b may be inductively coupled to metallic electrodes 1204a, 1204b, 1204c, 1204d or other components of the micro-electronic devices 1102a, 1102b through the hermetic seal 1004a, 1004b without actually puncturing the hermetic seal 1004a, 1004b, thereby preserving the integrity of the seal 1004 and preventing the micro-electronic devices from contacting the outside environment. The hermetic seal 1004 may also contain a "window" made of glass, sapphire, or some other material such that radio frequency waves, microwaves, or light may pass through the window to communicate with another device without breaking the physical hermetic seal 1004.

NON-LIMITING EMBODIMENTS

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A hermetically sealed electronic device, comprising:
   a top surface;
   a plurality of sides;
   a base layer formed from a substrate comprising one of ultra-thin glass and ceramic, the substrate formed using one of panel and roll to roll processing;
   one or more layers bonded to the base layer; and
   a hermetic sealant completely encasing the top surface and the plurality of sides while bonding to the base layer.

2. The hermetically sealed electronic device of claim 1, wherein the hermetic sealant is composed of at least one of Si, SiN, $Si_3N_4$, $SiO_2$, Ti, polymer and metal.

3. The hermetically sealed electronic device of claim 2, wherein the electronic device further comprises at least one electronic component attached to one of the layers.

4. The hermetically sealed electronic device of claim 3, wherein the at least one electronic component comprises at least one of a microcontroller, a power management system, a memory, a battery, a capacitor, an alternate energy source, one or more electrodes, an antenna and an alternate communication means.

5. The hermetically sealed electronic device of claim 4, wherein the at least one electronic component is further encased by the hermetic sealant.

6. The hermetically sealed electronic device of claim 5, wherein the at least one electronic component communicates with another electronic device via at least one of a feed through the hermetic sealant, inductive coupling and wireless communication through the hermetic seal.

* * * * *